(12) United States Patent
Peh et al.

(10) Patent No.: US 9,034,734 B2
(45) Date of Patent: May 19, 2015

(54) SYSTEMS AND METHODS FOR PLASMA ETCHING COMPOUND SEMICONDUCTOR (CS) DIES AND PASSIVELY ALIGNING THE DIES

(71) Applicant: Avago Technologies General IP (Singapore) Pte. Ltd., Singapore (SG)

(72) Inventors: Chee Siong Peh, Singapore (SG); Chiew Hai Ng, Singapore (SG); David G. McIntyre, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/758,265

(22) Filed: Feb. 4, 2013

(65) Prior Publication Data

US 2014/0217556 A1 Aug. 7, 2014

(51) Int. Cl.
| | |
|---|---|
| H01L 21/46 | (2006.01) |
| H01L 21/78 | (2006.01) |
| H01L 21/301 | (2006.01) |
| H01L 21/44 | (2006.01) |
| H01L 21/48 | (2006.01) |
| H01L 21/50 | (2006.01) |
| H01L 21/76 | (2006.01) |
| H01L 21/30 | (2006.01) |
| H01L 23/544 | (2006.01) |
| H01L 21/302 | (2006.01) |
| H01L 21/683 | (2006.01) |

(52) U.S. Cl.
CPC .............. *H01L 23/544* (2013.01); *H01L 21/50* (2013.01); *H01L 21/78* (2013.01); *H01L 21/302* (2013.01); *H01L 21/6836* (2013.01); H01L 2221/68336 (2013.01); Y10S 438/975 (2013.01)

(58) Field of Classification Search
USPC .......... 438/113, 458, 462, 401, 975; 257/620, 257/797
See application file for complete search history.

(56) References Cited

U.S. PATENT DOCUMENTS

| | | | |
|---|---|---|---|
| 4,908,772 A | | 3/1990 | Chi |
| 5,859,707 A | | 1/1999 | Nakagawa et al. |
| 6,007,357 A | * | 12/1999 | Perino et al. .................. 439/327 |
| 6,573,156 B1 | | 6/2003 | Wang et al. |
| 6,857,627 B2 | | 2/2005 | Gordon |
| 7,093,220 B2 | | 8/2006 | Fallon et al. |
| 7,989,266 B2 | | 8/2011 | Borthakur et al. |
| 8,384,231 B2 | | 2/2013 | Grivna et al. |
| 2009/0321758 A1 | * | 12/2009 | Liu et al. .......................... 257/98 |
| 2010/0048001 A1 | | 2/2010 | Harikai et al. |

(Continued)

OTHER PUBLICATIONS

Plasma Dicing and Scribing Technology for GaAs Based Devices, Article, Technical Report.

(Continued)

*Primary Examiner* — A. Sefer
*Assistant Examiner* — Dilinh Nguyen

(57) ABSTRACT

Methods are provided for using masking techniques and plasma etching techniques to dice a compound semiconductor wafer into dies. Using these methods allows compound semiconductor die to be obtained that have smooth side walls, a variety of shapes and dimensions, and a variety of side wall profiles. In addition, by using these techniques to perform the dicing operations, the locations of features of the die relative to the side walls are ascertainable with certainty such that one or more of the side walls can be used as a passive alignment feature to precisely align one or more of the die with an external device.

20 Claims, 7 Drawing Sheets

(56) References Cited

U.S. PATENT DOCUMENTS

2011/0289772 A1  12/2011  Kosaka et al.
2012/0238073 A1   9/2012  Johnson et al.
2012/0322238 A1  12/2012  Lei et al.

OTHER PUBLICATIONS

IC Assembly System, Catalog, 2013, Panasonic.
Emerging Trends in Wafer Singulation, Article, Jan. 2010, Tech Search, Austin, TX, United States.
Wei-Sheng Lei, Ajay Kumar, Rao Yalamanchill, Die Singulation Technologies for Advanced Packaging: A critical review, Review Article, Apr. 6, 2012, vol. 30 Issue 4, Journal of Vacuum Science & Technology B, Published Online.
"Improving Yields With Plasma Dicing," SPTS.com, Oct. 13, 2014, 2 pages, SPTS, www.spts.com/banners/wafer-dicing.
D. Pays-Volard, L. Martinez, K. MacKenzie, C. Johnson, T. Lazerand, R. Westerman and D. Lishan, "Productivity Improvement Using Plasma-based Die Singulation," CS MANTECH Conference, May 19-22, 2014, pp. 279-282, Denver, Colorado, USA.

* cited by examiner

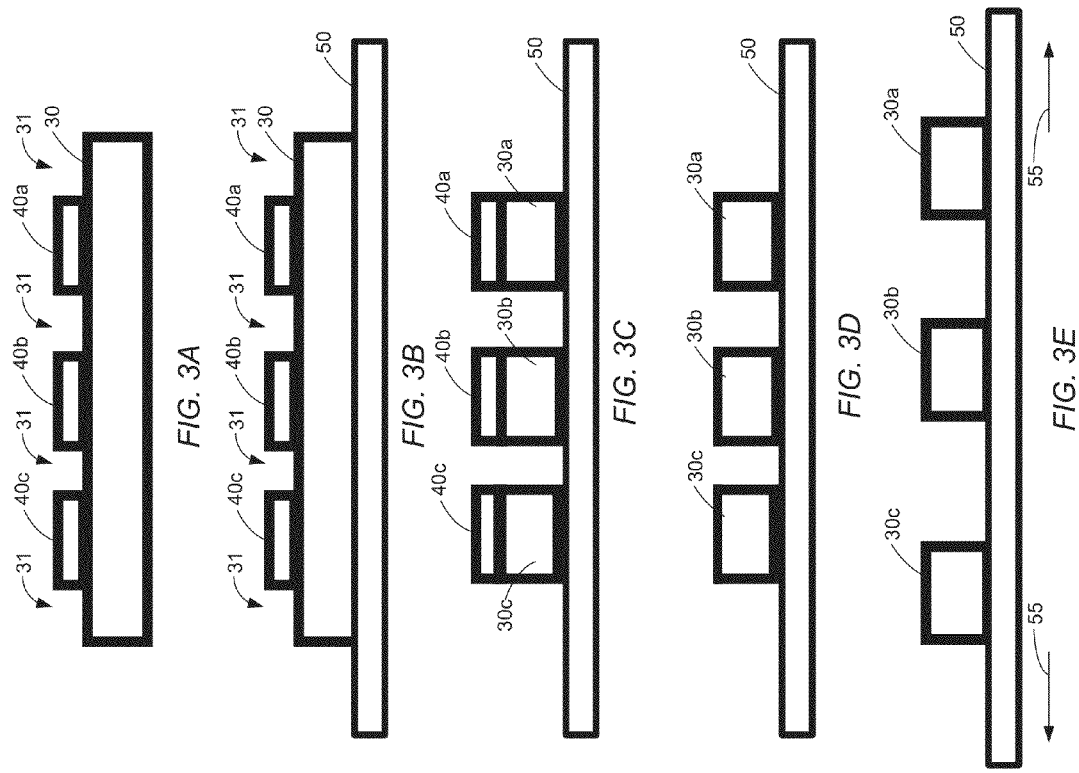

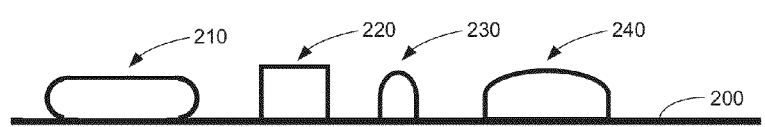
FIG. 5
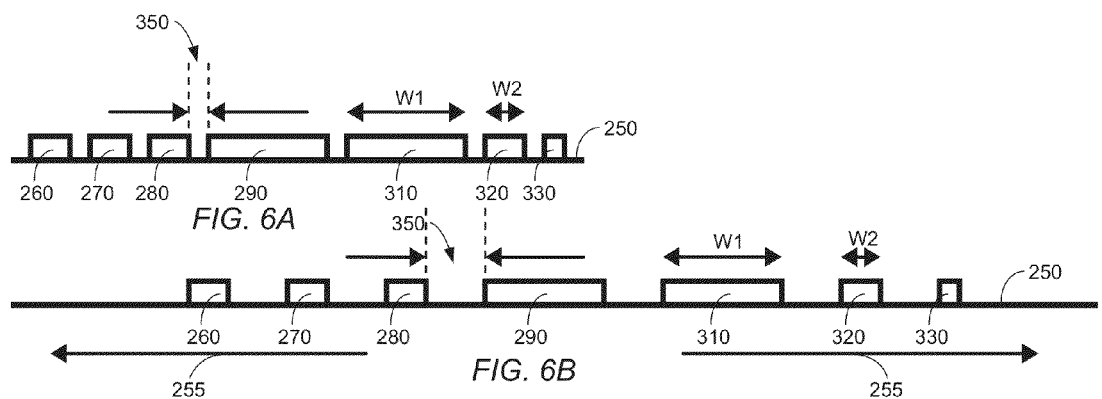
FIG. 6A
FIG. 6B

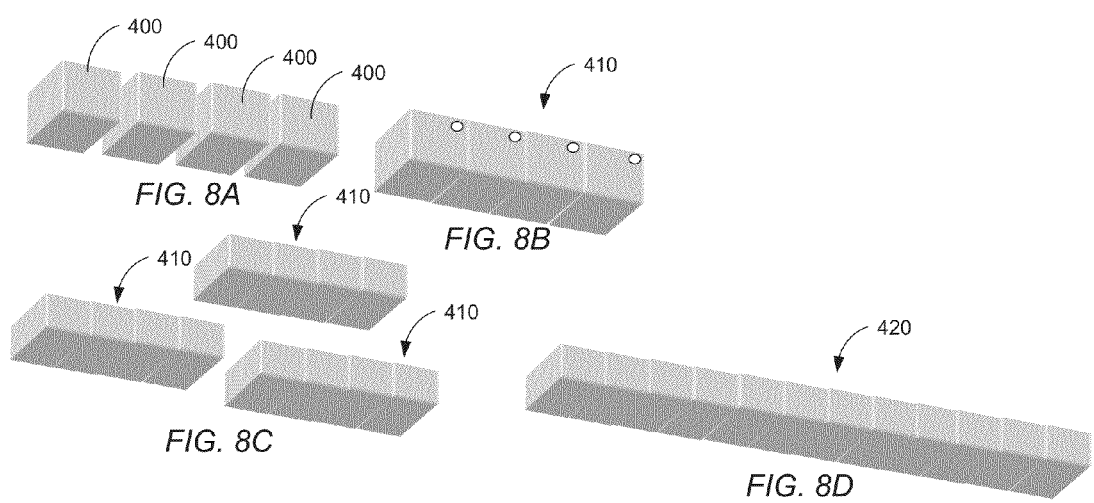

SYSTEMS AND METHODS FOR PLASMA ETCHING COMPOUND SEMICONDUCTOR (CS) DIES AND PASSIVELY ALIGNING THE DIES

TECHNICAL FIELD OF THE INVENTION

The invention relates to semiconductor wafers and processes. More particularly, the invention relates to methods for dicing a compound semiconductor wafer, and the diced wafers and die obtained by those methods.

BACKGROUND OF THE INVENTION

Semiconductor fabrication processes are multi-step processes that are used to create integrated circuits (ICs) that are used in a variety of applications. The process begins with the epitaxial growth of the wafer followed by many processing steps, such as deposition processes (e.g., chemical vapor deposition, molecular beam epitaxy, physical vapor deposition, atomic layer deposition), removal processes (e.g., wet etching, plasma etching, chemical-mechanical planarization), patterning processes (photolithography), and electrical property modification processes (e.g., diffusion, ion implantation). Typically, hundreds of such processing steps are performed to fabricate a wafer.

After the wafers have been fabricated, they are typically subjected to a variety of tests to verify that the wafers and the ICs formed on them meet certain standards. After testing, the wafers are diced to divide each wafer into many individual dies. Each die corresponds to an IC chip that will later be packaged in an IC package that is ready for use. Different dicing techniques are used, such as scoring and breaking, sawing, laser cutting, and etching.

With respect to scribing and breaking or sawing, it is difficult to achieve side walls for the dies that are very smooth. Rather, the side walls of the dies are often rough or jagged, which can eventually lead to mechanical defects being formed in the dies (e.g., through chipping or cracking). For example, typical sawing or cutting techniques can result in variations greater than 10 micrometers (microns) from die to die. In recent years, plasma etching tools and techniques have been used to perform the dicing operations on wafers. Using plasma etching for this purpose enables very precise dimensions for the dies to be obtained and can result in the dies having very smooth side walls.

SUMMARY OF THE INVENTION

The invention provides a method for using a plasma etching process to dice compound semiconductor wafers into dies, compound semiconductor dies obtained thereby, and an array of passively-aligned compound semiconductor dies. The method comprises:

providing at least a first compound semiconductor die that has been diced from a compound semiconductor wafer by a plasma etch dicing process that provides the first die with at least one side wall that has a known spatial relationship to at least one element formed on or in a surface of the first CS die; and passively aligning the first CS die with an external device by placing the side wall in abutment with the external device. The known spatial relationship of the side wall to the element allows the side wall to be used as a passive alignment feature such that passively aligning the side wall with the external device results in passive alignment of the element of the die with the external device.

The compound semiconductor die of the invention is a die that has been diced by a plasma etch dicing process in such a way that a known spatial relationship is created between at least one side wall of the die and at least one element formed on or in a surface of the die. The known spatial relationship of said at least one side wall to said at least one element allows said at least one side wall to be used as a passive alignment feature such that passively aligning said at least one side wall with an external device results in passive alignment of said at least one element with the external device.

The array of compound semiconductor dies comprises compound semiconductor dies that have been diced from one or more compound semiconductor wafers by a plasma etch dicing process that provides each die with at least one side wall that has a known spatial relationship to at least one element formed on or in a surface of the respective die. The known spatial relationships allow the respective side walls to be used as respective passive alignment features such that passively aligning the respective side walls of the respective dies with one another results in passive alignment of the respective elements of the respective dies with one another.

These and other features and advantages of the invention will become apparent from the following description, drawings and claims.

BRIEF DESCRIPTION OF THE DRAWINGS

FIGS. 3A-3E are side plan views of a compound semiconductor wafer as it is processed in accordance with the method represented by the flowchart shown in FIG. 2.

FIG. 5 is a side perspective view of a plurality compound semiconductor dies having a plurality of different shapes and sizes disposed on an adhesive-bearing surface of a piece of tape, which have been diced from the same wafer using the process described above with reference to FIGS. 1-3E.

FIGS. 6A and 6B illustrate side views of a plurality of compound semiconductor dies disposed on an adhesive-bearing side of a piece of tape before and after, respectively, the piece of tape has been stretched in the directions indicated by arrows.

FIGS. 8A, 8B, 8C, and 8D are perspective views of a plurality of dies arranged in different side-by-side configurations, each of which is useful in various applications.

DETAILED DESCRIPTION OF AN ILLUSTRATIVE EMBODIMENT

Figure 1:
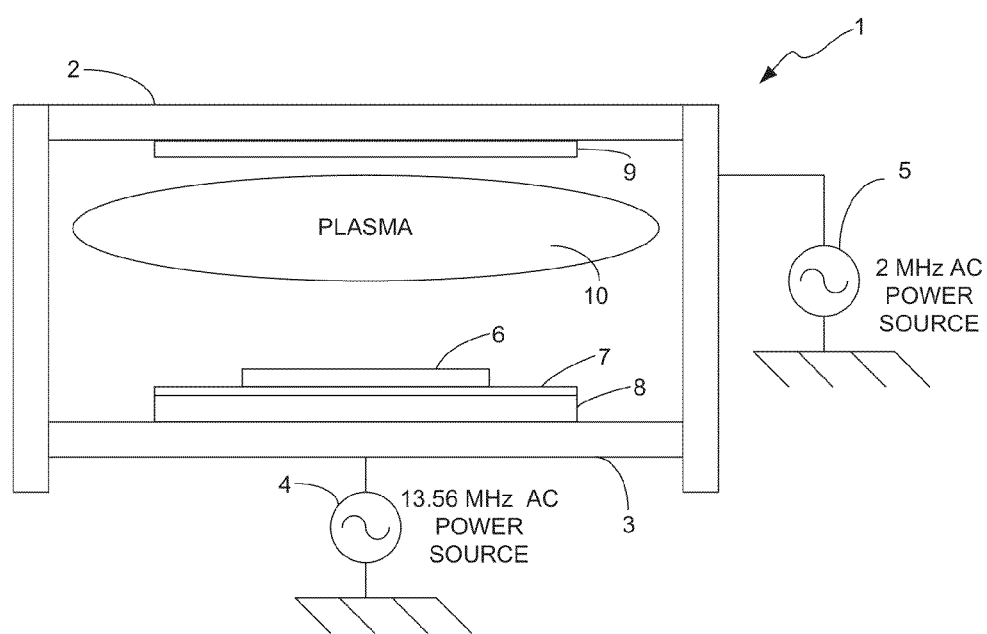
FIG. 1 illustrates a pictorial diagram of the system in accordance with an illustrative embodiment, which is a plasma etching chamber that has been adapted to perform plasma etching to dice compound semiconductor wafers into dies.

In accordance with the invention, methods are provided that use masking techniques and plasma etching techniques to dice a compound semiconductor wafer. Using these systems and methods allow compound semiconductor die to be obtained that have smooth side walls, a variety of shapes and dimensions, and a variety of side wall profiles. In addition, by using these techniques to perform the dicing operations, the locations of features of the die relative to the side walls are ascertainable with certainty such that one or more of the side walls can be used as a passive alignment mechanism to precisely align features of the die with an external device. Illustrative embodiments of the methods, systems and the resulting dies will now be described with reference to the figures, in which like reference numerals represent like elements, components or features.

FIG. 1 illustrates a pictorial diagram of a plasma etching chamber that may be used to perform plasma etching to dice compound semiconductor wafers into dies. Plasma etching techniques have been used to dice compound semiconductor wafers into dies, so any known techniques and tools are suitable for this purpose. The system 1 includes an etching chamber 2, a cooling system 3, a first radio frequency (RF) power source 4, and a second RF power source 5. In accordance with this illustrative embodiment, the first RF power source 4 is a 13.56 megahertz (MHz) RF power source and the second RF power source 5 is a 2 MHz RF power source. The first RF power source 4 is used for setting the bias voltage of the semiconductor wafer 6, which is positioned on an adhesive-bearing side of a piece of tape 7. The piece of tape 7 is positioned on an upper surface of a plate 8 that is electrically coupled to the first RF power source 4. The second RF power source 5 is used for setting the bias voltage of an upper plate 9, which is electrically coupled to the second RF power source 5.

The first and second RF power sources 4 and 5 provide time-varying electrical currents that create time-varying magnetic fields about a rarefied gas (not shown) disposed in the chamber 2. The time-varying magnetic fields induce electrical currents in the gas to create a plasma 10. This process of creating plasma is referred to in the art as an inductively coupled plasma (ICP) process. The gas chemistry that is used in the chamber 2 is typically based on either a methane base ($CH_4$) or a chlorine base ($Cl_2$, $BCl_3$). Different gas ratios are used to etch different types of compounds, and therefore the gas ratio that is used to etch the wafer 6 will depend on the compound comprising the wafer 6. The wafer compound is typically a III-V compound (i.e., made up of combination of two or more of Ga, As, Al, In, and Ph).

Figure 2:
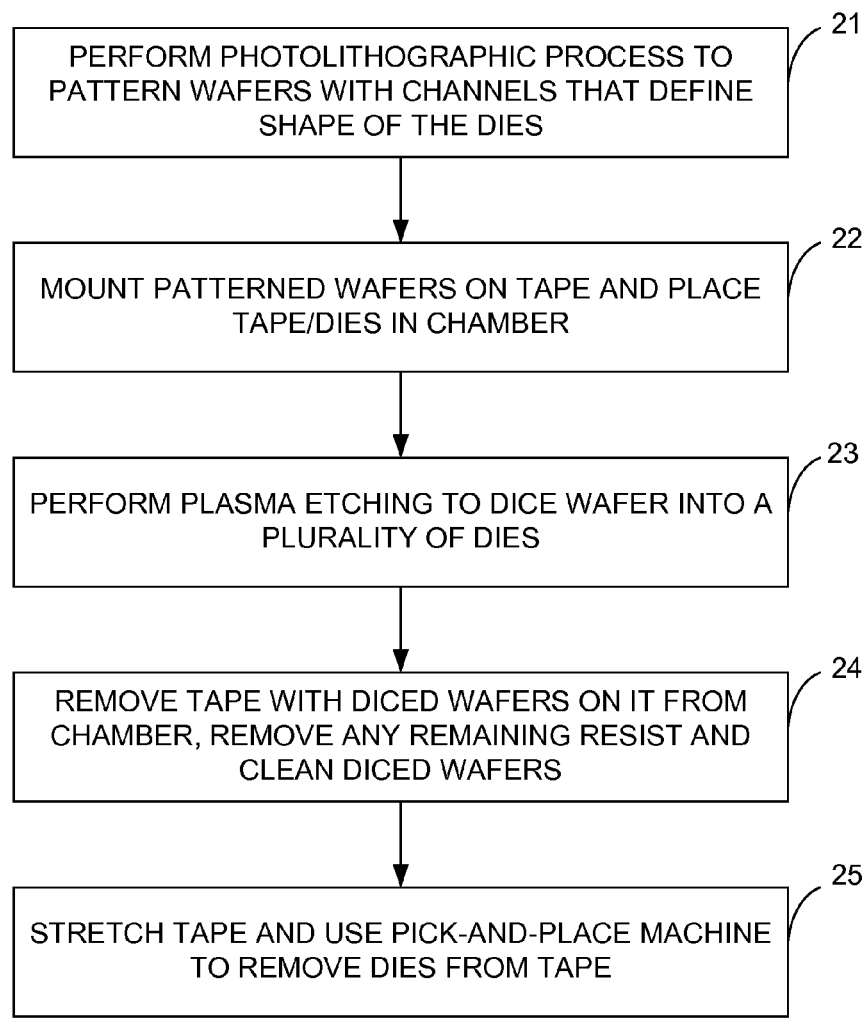
FIG. 2 is a flowchart that represents the method in accordance with an illustrative embodiment.

FIG. 2 is a flowchart that represents the method performed by the system shown in FIG. 1. FIGS. 3A-3E are side plan views of a compound semiconductor wafer 30 as it is processed in accordance with the method represented by the flowchart shown in FIG. 2. The method will be described with reference to FIGS. 2 and 3A-3E. Known photolithographic processing steps are performed to form openings, or channels, 31 (FIGS. 3A and 3B) in a layer of photoresist 40 disposed on an upper surface of the wafer 30, leaving a patterned photoresist layer 40a, 40b and 40c on top of the upper surface of the wafer 30. This step is represented by block 21 in FIG. 2 and the device shown in FIG. 3A. The patterned photoresist layer 40a-40c acts as a mask that will protect the covered portions of the wafer 30 from the subsequent plasma etching process while leaving the uncovered, exposed portions of the wafer 30 vulnerable to the subsequent plasma etching process. While photolithographic processes are well suited for creating the mask, any suitable process and material may be used to create the mask.

The wafer 30 having the patterned photoresist layer 40a-40c on it is then placed on an adhesive-bearing side of a piece of tape 50, as indicated by block 22 in FIG. 2 and FIG. 3B. The tape 50 having the wafer 30 on it, as shown in FIG. 3B, is then placed inside of the chamber 2 shown in FIG. 1 and subjected to the plasma etching process described above with reference to FIG. 1. This step is represented by block 23 in FIG. 2 and by FIG. 3C. It can be seen in FIG. 3C that the portions of the wafer 30 that are not masked from the plasma etch by the patterned photoresist layer 40a-40c are etched away, leaving only the masked portions of the wafer 30 and the photoresist 40a-40c disposed on top of it. The masked portions of the wafer 30 correspond to the individual dies 30a, 30b and 30c.

After the plasma etching process has been completed, the tape 50 having the wafer 30 thereon is removed from the chamber 2 and the remaining photoresist layer 40a-40c is removed using ashing and chemical rinse processes (not shown for purposes of clarity), leaving only the tape having the dies 30a, 30b and 30c thereon. This step is represented by block 24 in FIG. 2 and by FIG. 3D. The tape 50 is then stretched in the directions indicated by arrows 55 in FIG. 3E and by block 25 in FIG. 2 to increase the lateral spacing between the dies 30a-30c. Stretching the tape 50 in this manner makes it easier for a pick-and-place machine (not shown for purposes of clarity) to be used to pick the dies 30a-30c up off of the tape 50.

Using the plasma etching process described above to dice the wafer 30 allows the dies to have any shape that can be defined by patterning photoresist, unlike conventional techniques used for dicing compound semiconductor wafers, which only allow dies having fixed rectangular shapes to be formed. In addition, using the plasma etching process results in the dies having very smooth side walls, which, as stated above, is generally not the case with conventional sawing or cutting singulation processes used for dicing compound semiconductor wafers. With the plasma etch dicing process, smoothness of the side walls is such that side wall variations from die to die are typically less than 10 microns, and often less than 5 microns. Furthermore, using the plasma etching process allows the dies to have any desired side wall profile.

Figure 4A:
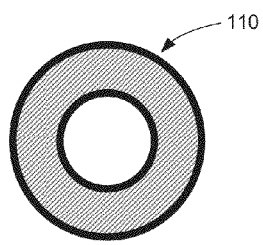
FIGS. 4A-4F illustrate top plan views of compound semiconductor dies having a variety of shapes that have been made using the plasma etching method and system described above with reference to FIGS. 1-3E.
Figure 4B:
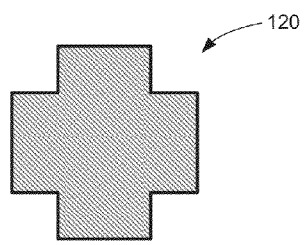
Figure 4C:
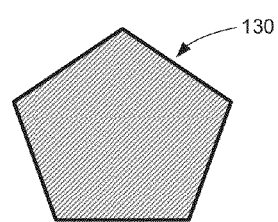
Figure 4D:
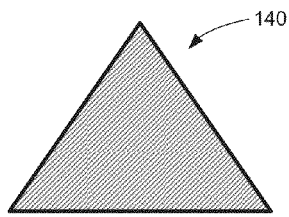
Figure 4E:
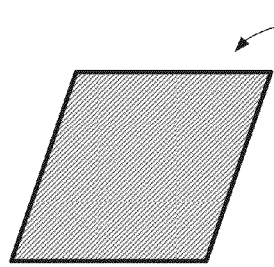
Figure 4F:
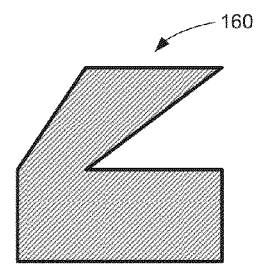

In accordance with the invention, it has been determined that a plasma etching process such as described above with reference to FIGS. 1-3E may be used to dice wafers into dies that have non-rectangular shapes. FIGS. 4A-4F illustrate top plan views of compound semiconductor dies having a variety of non-rectangular shapes that have been made using the plasma etching method and system described above with reference to FIGS. 1-3E. The die shapes shown in FIGS. 4A-4E are a torus 110, a cross 120, a pentagon 130, a triangle 140, and a parallelogram 150, respectively. The die shape 160 shown in FIG. 4F is an irregular, non-rectangular shape having a variety of angles, side wall dimensions and side wall profiles. With conventional sawing or cutting dicing processes often used for dicing compound semiconductor wafers, the indexing of the sawing or cutting tool is fixed, so the die size and the channel width (i.e., the distance between dies) is fixed. Also, with conventional sawing or cutting dicing processes, the sawing or cutting tool is limited to making cuts that are orthogonal to one another such that the dies always are rectangular in shape.

With the plasma etch dicing process, a variety of nonrectangular die shapes are obtainable, such as those shown in FIGS. 4A-4E, for example. Essentially, any pattern that can be photolithographically formed in the photoresist layer can be transferred onto the wafer to define the shape of the dies. One of the advantages of being able to dice compound semiconductor wafers into dies having non-rectangular shapes is that it allows the shape of the resulting die to be used as a passive alignment feature for precisely aligning the die with an external device or element. Being able to use the shape of the die as a passive alignment feature allows a feature located on one of the surfaces of the die to be brought into alignment with an external device or element by passively aligning one or more walls of the die with an external device or feature having a shape that is complementary to the shape of the die wall or walls that are being used as the passive alignment feature. For example, this passive alignment method could be used to bring a light-emitting facet of a laser diode die into optical alignment with a lens or an end of an optical fiber. As another example, this passive alignment method could be used to bring a light-receiving facet of a photodiode die into optical alignment with a lens or an end of an optical fiber.

FIG. 5 is a side perspective view of a plurality of dies having a plurality of different shapes and sizes disposed on an adhesive-bearing surface of a piece of tape 200, which have been diced from the same wafer using the process described above with reference to FIG. 1-3E, except that the process has been adapted in accordance with embodiments of the invention to achieve the different die shapes and sizes. The shapes of these dies 210, 220, 230, and 240 are obtained by carefully controlling the patterned photoresist layer (not shown for purposes of clarity) and/or its thickness. For example, with respect to die 210, this shape could be achieved by, for example, making the patterned photoresist layer thinner toward the outer edges of the intended die 210 and thicker elsewhere, causing the wafer to etch faster along the outer edges than in other areas in order to make the side walls curved. With respect to die 220, the patterned photoresist layer would have had a uniform thickness. With respect to die 230, the patterned photoresist layer would have been thinner toward the outer edges of the intended die 230 and thicker elsewhere, causing the wafer to etch faster along the outer edges than in other areas. The same would be true for die 240.

In addition, the plasma etching need not be directional (i.e., straight down in a direction normal to the tape 200) in all cases. The gas chemistry may be changed during the etching process. Because different semiconductor compounds etch at different rates for different gas chemistries, using more than one gas chemistry during the etching process can result in different die shapes, such as the arched upper surfaces of the dies 230 and 240 and the curved side walls of die 210.

FIGS. 6A and 6B illustrate side views of a plurality of compound semiconductor dies 260-330 disposed on an adhesive-bearing side of a piece of tape 250 before and after, respectively, the piece of tape 250 has been stretched in the directions indicated by arrows 255. The dies 260-330 do not all have the same width-wise dimensions. For example, dies 310 and 320 have widths W1 and W2, which are not the same. Also the channel spacing 350 between the dies 310-330 is not exactly the same for all of the adjacent dies 310-330 on the piece of tape 250. The width-wise dimensions of the dies 310-330 and the channel spacing between the dies 310-330 is easily controllable by controlling the patterning of the photoresist layer (not shown for purposes of clarity) described above with reference to FIGS. 1-3E. The manner in which the photoresist layer may be patterned is well known, and therefore will not be described herein. The manner in which plasma etching is performed is also well known, and therefore will not be described herein.

Figure 7A:
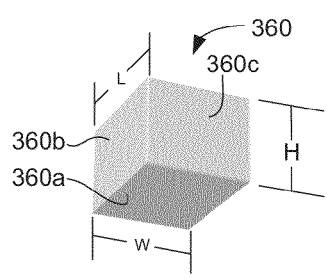
FIG. 7A is a perspective view of a rectangular-shaped die obtained by using the plasma etch dicing process described above with reference to FIGS. 1-3E.

As indicated above, using plasma etching to dice the dies results in the dies having very smooth side walls compared to the relatively rough or jagged side walls of the dies that often result from dicing processes that use cutting or sawing. In accordance with embodiments of the invention, it has been determined that this characteristic of plasma-etched dies can be used to make a physical feature of the die, such as a side wall, for example, a passive alignment feature. FIG. 7A is a perspective view of a rectangular-shaped die 360 obtained by using the plasma etch dicing process described above with reference to FIGS. 1-3E. One of the advantages of this feature is that it allows the side walls of the dies to be used for passive alignment purposes to achieve very precise passive alignment of the die with some other object, device or element. This has generally not been possible when using sawing or cutting to dice compound semiconductor wafers due to the possibility of the side walls being too rough. An example of the manner in which the smooth side walls of the die 360 make it suitable for use in a passive alignment scenario will now be described with reference to FIGS. 7A-7C.

Figure 7B:
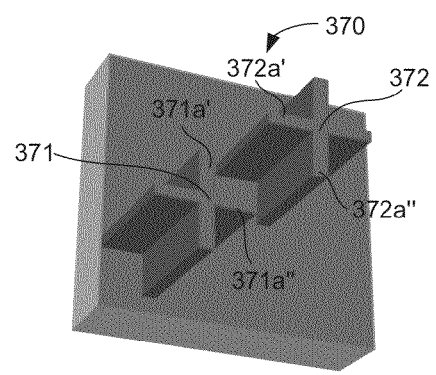
FIG. 7B is a perspective view of an alignment base that has passive alignment features disposed on it for engaging with the die shown in FIG. 7A.

FIG. 7B is a perspective view of an alignment base 370 that has passive alignment features 371 and 372 disposed on it. For this example, it is assumed that the base 370 is very precisely formed in terms of its dimensions and locations of features 371 and 372. The features 371 and 372 are precisely dimensioned and spaced apart to match the width, W, and height, H, dimensions of the die 360 (FIG. 7A). Each of the features 371 and 372 has a pair of side walls 371a' and 371a" and 372a' and 372a", respectively, that forms a right angle that precisely matches the right angles formed by the bottom and left side surfaces 360a, 360b and the bottom and right side surfaces 360a, 360c of the die 360. Therefore, when the die 360 is precisely aligned with the features 371 and 372, the die fits precisely in the rectangular space defined by the pairs of side walls 371a' and 371a" and 372a' and 372a".

Figure 7C:
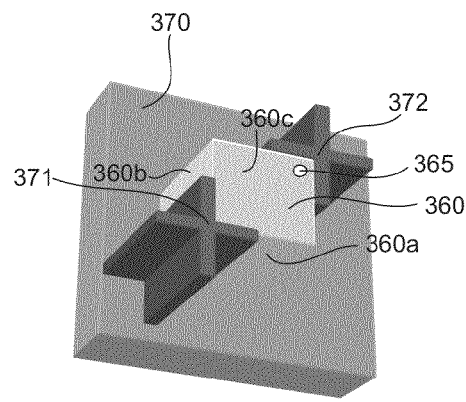
FIG. 7C is a perspective view of the alignment base shown in FIG. 7B engaged with the die shown in FIG. 7A.

FIG. 7C is a perspective view of the alignment base 370 engaged with the die 360. Because of the smoothness of the side walls 360a-360c of the die 360, it can be ensured that when the die 360 is engaged with the alignment base 370, the die 360 is in precise alignment with the base 370. This, in turn, ensures that any feature disposed on or formed in the side wall 360c of the die 360 is at a very precise location relative to the base 370. Thus, placing the base 370 at a precisely-defined location relative to some other device or structure (not shown for purposes of clarity), ensures that the die 360 is at a precisely-defined location relative to that same device or structure. This is very beneficial, especially in cases where the die is a laser diode or a photodiode having a light-emitting or light-receiving aperture, respectively, that needs to be precisely optically aligned with another element, such as a lens, for example. For example, if the die is a laser diode and the feature 365 is a light-emitting aperture of the laser diode, precise optical alignment of the base 370 with an external optics system (not shown for clarity) would result in precise optical alignment of the light-emitting aperture 365 with the external optics system.

FIGS. 8A, 8B, 8C, and 8D are perspective views of a plurality of dies 400 arranged in different side-by-side configurations, each of which is useful in various applications. For exemplary purposes, it will be assumed that the dies are laser diodes, such as vertical cavity surface emitting laser diodes (VCSELs). One of the difficulties associated with manufacturing semiconductor dies that have arrays of laser diodes is that if any of the laser diodes on the die is defective, the die is discarded. This reduces yield and increases costs.

One way to avoid the risk of having to discard a die that contains multiple laser diodes due to one of the laser diodes being defective is to singulate the wafer into individual dies and then mount dies that are known to be non-defective in a side-by-side arrangement to form arrays of a desired size. Because the side walls of the dies can be made very smooth by using the plasma etch dicing process described above, the dies can be used as singlets 400 (FIG. 8A) that are mounted separately using an alignment base such as that shown in FIGS. 7B and 7C, they can be placed in abutment with one another to form a subarray 410 (FIG. 8B), or multiple subarrays 410 can be placed in abutment with one another to form a larger array 420. The smooth side walls of the dies 400 allows the side walls to be used to passively align the dies 400 with adjacent dies 400 in the subarray 410 or the larger array 420. The same is true if the dies 400 were some other type of die, such as photodiode dies, for example. The ability to create arrays of laser diodes or photodiodes in this manner with precise alignment is very useful in parallel transmitters, receivers and transceivers.

It should be noted that the invention has been described with respect to illustrative embodiments for the purpose of describing the principles and concepts of the invention. The invention is not limited to these embodiments. For example, while the invention has been described with reference to obtaining certain die shapes, the invention is not limited to the die shapes described herein or shown in the figures. Persons of skill in the art will understand, in view of the description being provided herein, that the processes described above can be varied to achieve a variety of other die shapes. Those skilled in the art will understand, in view of the description being provided herein, that many modifications may be made to the embodiments described herein while still achieving the goals of the invention and that all such modifications are within the scope of the invention.

What is claimed is:

1. A method of passively aligning at least a first compound semiconductor (CS) die with an external device, the method comprising:
    providing at least a first CS die that has been diced from a CS wafer by a plasma etch dicing process that provides the first CS die with at least one side wall that has a known spatial relationship to at least one optical element formed on or in a surface of the first CS die;
    providing an external device with at least one alignment feature extending upwardly from a top surface of the external device; and
    aligning the first CS die with the external device by placing said at least one side wall of the first CS die in abutment with the alignment feature of the external device, wherein the known spatial relationship of said at least one side wall to said at least one optical element allows said at least one side wall to be used as a passive alignment feature such that passively aligning the side wall with the alignment feature results in passive alignment of said at least one optical element with the external device.

2. The method of claim 1, wherein the plasma etch dicing process that is used results in at least first and second side walls of the first CS die having known spatial relationships to said at least one optical element and to one another, wherein external device further comprises a second alignment feature extending upwardly from the top surface of the external device, and wherein the step of aligning further comprises:
    placing the first and second side walls in abutment with the first and second alignment features of the external device, wherein placing the first and second side walls in abutment with the first and second alignment featured of the external device results in passive alignment of the external device with said at least one optical element.

3. The method of claim 2, wherein the first and second side walls are substantially perpendicular to one another, and wherein said at least one optical element is formed on or in a surface of the die that is substantially perpendicular to the first and second side walls.

4. The method of claim 2, wherein the first CS die has a shape of a rectangle, and wherein the first and second side walls are substantially parallel to one another and substantially perpendicular to said surface.

5. The method of claim 2, wherein the external device is an alignment base, and wherein the first and second alignment features each further include a first sidewall and second sidewall forming a right angle and the first alignment feature and second alignment feature are positioned on the top surface of the alignment base so as to receive the first CS die.

6. The method of claim 5 further comprising aligning the alignment base with a second external structure such that the passive alignment of said at least one optical element with the alignment base results in a passive alignment of said at least one optical element with the second external structure.

7. The method of claim 1, wherein the first CS die has a shape of a rectangle.

8. The method of claim 1, wherein the first CS die has a non-rectangular shape.

9. The method of claim 1, wherein the first CS die is a laser diode die and wherein said at least one optical element is a light-emitting facet of the die.

10. The method of claim 1, wherein the first CS die is a photodiode die and wherein said at least one optical element is a light-receiving facet of the die.

11. The method of claim 1, wherein the external device is an alignment base and the alignment feature further includes a first sidewall and a second sidewall forming a right angle configured to receive the first CS die.

12. The method of claim 11 further comprising aligning the alignment base with a second external structure such that the passive alignment of said at least one optical element with the alignment base results in a passive alignment of said at least one optical element with the second external structure.

13. A method of passively aligning at least a first compound semiconductor (CS) die with a second CS die, the method comprising:
    providing at least a first CS die that has been diced from a CS wafer by a plasma etch dicing process that provides the first CS die with at least one side wall that has a known spatial relationship to at least one optical element formed on or in a surface of the first CS die;
    providing a second CS die that has been diced from a CS wafer by a plasma etch dicing process that provides the second CS die with at least one side wall that has a known spatial relationship to at least one element formed on or in a surface of the second CS die;
    passively aligning the first CS die with the second CS die by placing said at least one side wall of the first CS die in abutment with said at least one side wall of the second CS die, and wherein the known spatial relationship of said at least one side wall of the second CS die to said at least one element of the second CS die allows said at least one side wall of the second CS die to be used as a passive alignment feature such that passively aligning said at least one side wall of the first CS die with said at least one side wall of the second CS die results in passive alignment of said at least one element of the second CS die with said at least one element of the first CS die.

14. The method of claim 13, wherein the first CS die and second CS die have a non-rectangular shape.

15. The method of claim 13, wherein the first CS die is a laser diode die and wherein said at least one optical element of the first CS die is a light-emitting facet of the die.

16. The method of claim 15, wherein the second CS die is a laser diode die and wherein said at least one optical element of the second CS die is a light-emitting face of the die.

17. The method of claim 16, wherein the first CS die and the second CS die form a part of an array of laser diode CS dies.

18. The method of claim 13, wherein the first CS die is a photodiode die and wherein said at least one optical element of the first CS die is a light-receiving facet of the die.

19. The method of claim 18, wherein the second CS die is a photodiode die and wherein said at least one optical element of the second CS die is a light-receiving facet of the die.

20. The method of claim 13, further comprising:
   providing a third CS die that has been diced from a CS wafer by a plasma etch dicing process that provides the third CS die with at least one side wall that has a known spatial relationship to at least one element formed on or in a surface of the third CS die; and
   passively aligning the second CS die with the third CS die by placing said at least one side wall of the second CS die in abutment with said at least one side wall of the third CS die, and wherein the known spatial relationship of said at least one side wall of the third CS die to said at least one element of the third CS die allows said at least one side wall of the third CS die to be used as a passive alignment feature such that passively aligning said at least one side wall of the second CS die with said at least one side wall of the third CS die results in passive alignment of said at least one element of the third CS die with said at least one element of the second CS die.

* * * * *